US005610801A

United States Patent [19]
Begis

[11] Patent Number: 5,610,801
[45] Date of Patent: Mar. 11, 1997

[54] MOTHERBOARD ASSEMBLY WHICH HAS A SINGLE SOCKET THAT CAN ACCEPT A SINGLE INTEGRATED CIRCUIT PACKAGE OR MULTIPLE INTEGRATED CIRCUIT PACKAGES

[75] Inventor: Glenn Begis, Hillsboro, Oreg.

[73] Assignee: Intel Corporation, Santa Clara, Calif.

[21] Appl. No.: 558,337

[22] Filed: Nov. 15, 1995

Related U.S. Application Data

[63] Continuation of Ser. No. 407,502, Mar. 20, 1995, abandoned.

[51] Int. Cl.$^6$ .............................. H05K 1/11; H01R 29/00
[52] U.S. Cl. ................... 361/784; 361/785; 361/791; 439/44; 439/47
[58] Field of Search ..................... 439/44–48, 74–75, 439/53, 64, 68; 361/784–791, 807, 809

[56] References Cited

U.S. PATENT DOCUMENTS

| | | |
|---|---|---|
| 3,829,741 | 8/1974 | Athey . |
| 4,439,815 | 3/1984 | Close et al. . |
| 4,683,550 | 7/1987 | Jindrick et al. . |
| 4,997,377 | 3/1991 | Goto et al. ................................ 439/68 |
| 5,268,820 | 12/1993 | Tseng et al. ........................... 361/785 |
| 5,384,692 | 1/1995 | Jaff ....................................... 361/807 |

Primary Examiner—Bot L. Ledynh
Attorney, Agent, or Firm—Blakely, Sokoloff, Taylor & Zafman

[57] ABSTRACT

A motherboard assembly which has an integrated circuit socket that can be mated with either a single integrated circuit package or a multiple integrated circuit package module. The motherboard has a socket connector which can receive the external pins of an integrated circuit package. The motherboard also has an auxiliary connector that can mate with a corresponding connector mounted to a daughterboard. Mounted to the daughterboard are a first integrated circuit package and a second integrated circuit package. Each package may contain a multi-processing microprocessor. The first integrated circuit package has a plurality of pins that mate with the socket connector. The daughterboard can be coupled to the motherboard by pressing the external pins of the first integrated circuit package into the socket connector and mating the auxiliary connectors. The present invention allows a plurality of processors to be plugged into a single socket without occupying a significant amount of space on the motherboard.

12 Claims, 1 Drawing Sheet

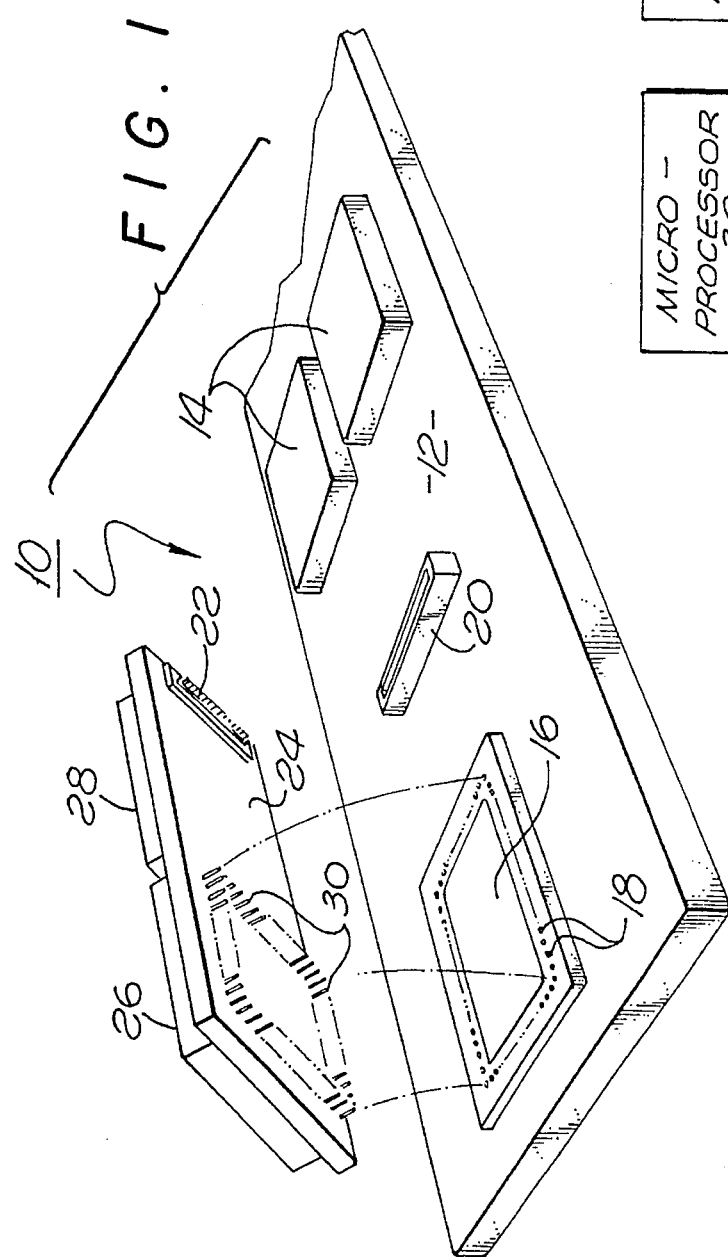
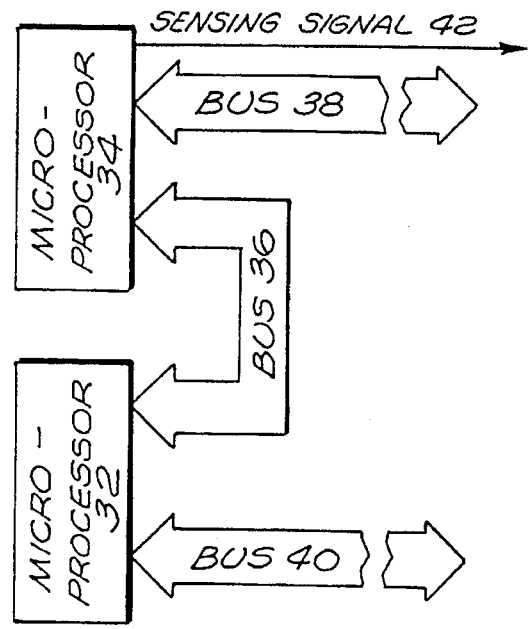

5,610,801

MOTHERBOARD ASSEMBLY WHICH HAS A SINGLE SOCKET THAT CAN ACCEPT A SINGLE INTEGRATED CIRCUIT PACKAGE OR MULTIPLE INTEGRATED CIRCUIT PACKAGES

This is a continuation of application Ser. No. 08/407,502 filed Mar. 20, 1995, now abandoned.

BACKGROUND OF THE INVENTION

1. Field of the Invention

The present invention relates to an electronic packaging assembly.

2. Description of Related Art

Computers typically contain a plurality of integrated circuit packages that are mounted to a printed circuit board commonly referred to as a motherboard. The integrated circuit packages and printed circuit board are typically located within a protective chassis.

To enhance the structural integrity of the computer assembly, the integrated circuit packages are typically soldered to the printed circuit board. It is sometimes desirable to upgrade the capability of the computer by replacing the existing integrated circuits. Replacing the circuits on a conventional printed circuit board assembly requires the process of reflowing solder. Reflowing solder is a time consuming and expensive process that is typically beyond the capability of the end user.

There has been developed integrated circuit packages that can be plugged into the motherboard. The packages each have a plurality of external pins which mate with a corresponding socket connector that is mounted to the motherboard. The pin and socket connectors allow the end user to easily replace an existing circuit of the computer. For example, the end user may upgrade the microprocessor of a computer by merely plugging in a new integrated circuit package.

It may be desirable to upgrade an existing single processor computer with two or more multi-processing processors. The additional processor requires a corresponding socket connector that is mounted to the motherboard. The second socket connector occupies additional space on the motherboard, which increases the overall size of the computer assembly. It would be desirable to provide a spatially efficient motherboard assembly which can receive either a single processor package or a multiple processor package.

SUMMARY OF THE INVENTION

The present invention is a motherboard assembly which has an integrated circuit socket that can be mated with either a single integrated circuit package or a multiple integrated circuit package module. The motherboard has a socket connector which can receive the external pins of an integrated circuit package. The motherboard also has an auxiliary connector that can mate with a corresponding connector mounted to a daughterboard. Mounted to the daughterboard are a first integrated circuit package and a second integrated circuit package. Each package may contain a multi-processing microprocessor. The first integrated circuit package has a plurality of pins that mate with the socket connector. The daughterboard can be coupled to the motherboard by pressing the external pins of the first integrated circuit package into the socket connector and mating the auxiliary connectors. The present invention allows a plurality of processors to be plugged into a single socket without occupying a significant amount of space on the motherboard.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a perspective view of the packaging assembly of the present invention;

FIG. 2 is a schematic of a daughterboard of the assembly.

DETAILED DESCRIPTION OF THE INVENTION

Referring to the drawings more particularly by reference numbers, FIG. 1 shows a motherboard assembly 10 of a computer system. The assembly 10 includes a first printed circuit board 12 which will be referred to as the motherboard. A plurality of integrated circuit (IC) packages 14 can be mounted to the motherboard 12. The packages 14 typically contain integrated circuits (not shown). The printed circuit board 12 contains a plurality of routing lines and power/ground planes that provide signals and power/ground to the integrated circuits located within the packages 14.

Mounted to the motherboard 12 is a socket connector 16. The socket connector 16 has a plurality of sockets 18 that can receive corresponding pins of an integrated circuit package. The socket connector 16 is electrically connected to the printed circuit board 12 so that a package plugged into the socket 16 can communicate with the other devices within the computer system. Also mounted to the motherboard 12 is a first auxiliary connector 20. The auxiliary connector 20 is typically of the pin or card edge type. The auxiliary connector 20 is also electrically connected to the printed circuit board 12.

The first auxiliary connector 20 mates with a second auxiliary connector 22 that is mounted to a second printed circuit board 24. The second circuit board 24 will be referred to as a daughterboard. The second printed circuit board 24 also has a plurality of routing lines and power planes.

Mounted to the daughterboard 24 is a first integrated circuit package 26 and a second integrated circuit package 28. Each integrated circuit package typically contains an integrated circuit (not shown). The first integrated circuit package 26 has a plurality of external pins 30 which can be inserted into the sockets 18 of the socket connector 16 to electrically and mechanically couple the package 26 to the motherboard 12. The pins 30 typically extend through holes in the daughterboard 24. The pins 30 may also be electrically connected to the second printed circuit board 24. The first integrated circuit package 24 may have additional pins, leads, solder balls, etc. (not shown) which also electrically couple the package 26 to the second printed circuit board 24.

The second integrated circuit package 28 is electrically connected to the second printed circuit board 24. The second integrated circuit package 28 can communicate with the first integrated circuit package 26 through the daughterboard 24, and with the motherboard 12 through the daughterboard 24 and auxiliary connectors 20 and 22.

The integrated circuit packages 26 and 28 can be coupled to the motherboard 12 by mating the auxiliary connectors 20 and 22, and plugging the external pins 30 of the first package 26 into the socket connector 16. If a dual package is not desired, the daughterboard 24 can be removed and a single integrated circuit package can be plugged into the socket connector 16. The motherboard assembly thus provides a single socket which will accept both a single IC package and a multiple IC package module.

As shown in FIG. 2, the integrated circuit packages 26 and 28 typically contain microprocessors 32 and 34, respectively. The microprocessors 32 and 34 can be coupled together for multi-processing by bus 36 in the daughterboard 24. The microprocessor 34 within the second integrated circuit package 28 may also receive power and communicate with the motherboard 12 through bus 38. The microprocessor 32 can communicate with the motherboard through bus 40. One of the microprocessors may also provide a sensing signal to the motherboard 12 on signal line 42. The sensing signal can be interpreted by the motherboard 12, so that the system is configured for a dual processor architecture when the daughterboard 24 is plugged into the motherboard. The daughterboard may have additional circuits, such as second levels caches, that further support the microprocessors.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic assembly, comprising:

a motherboard;

a daughterboard;

a first integrated circuit package mounted to said daughterboard, said integrated circuit package having a plurality of external pins;

a socket connector that is mounted and electrically connected to said motherboard and which receives said external pins of said first integrated circuit package to electrically couple said motherboard with said first integrated circuit;

a first connector mounted and electrically connected to said motherboard;

a second connector that is mounted and electrically connected to said daughterboard, and mates with said first connector to electrically couple said daughterboard with said motherboard.

2. The assembly as recited in claim 1, wherein said daughterboard is essentially parallel with said motherboard.

3. The assembly as recited in claim 1, further comprising a second integrated circuit package mounted to said daughterboard.

4. The assembly as recited in claim 3, wherein said first and second integrated circuit packages each contain a microprocessor.

5. The assembly as recited in claim 4, wherein said first and second connectors carry a sensing signal which provides an indication to said motherboard that both said first and second integrated circuit packages are coupled to said motherboard.

6. The assembly as recited in claim 1, wherein said first and second connectors have mating pins and sockets.

7. An electronic assembly, comprising:

a motherboard;

a daughterboard;

a first integrated circuit package mounted to said daughterboard;

first connector means for mating and electrically coupling said first integrated circuit package with said motherboard; and, second connector means for mating and electrically coupling said daughterboard with said motherboard.

8. The assembly as recited in claim 7, wherein said daughterboard is essentially parallel with said motherboard.

9. The assembly as recited in claim 7, further comprising a second integrated circuit package mounted to said daughterboard.

10. The assembly as recited in claim 9, wherein said first and second integrated circuit packages each contain a microprocessor.

11. The assembly as recited in claim 10, wherein said second connector means carry a sensing signal which provides an indication to said motherboard that both said first and second integrated circuit packages are coupled to said motherboard.

12. The assembly as recited in claim 7, wherein said second connector means include mating pin and socket connectors.

* * * * *